United States Patent
Hirata (10) Patent No.: US 10,201,907 B2
(45) Date of Patent: Feb. 12, 2019

(54) SIC WAFER PRODUCTING METHOD

(71) Applicant: DISCO CORPORATION, Tokyo (JP)

(72) Inventor: Kazuya Hirata, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/821,045

(22) Filed: Nov. 22, 2017

(65) Prior Publication Data

US 2018/0154542 A1    Jun. 7, 2018

(30) Foreign Application Priority Data

Dec. 2, 2016  (JP) ................................ 2016-234958

(51) Int. Cl.
| | |
|---|---|
| *H01L 21/20* | (2006.01) |
| *B23K 26/00* | (2014.01) |
| *H01L 21/00* | (2006.01) |
| *B26F 3/00* | (2006.01) |
| *C30B 29/36* | (2006.01) |
| *C30B 33/02* | (2006.01) |
| *H01L 29/16* | (2006.01) |
| *B26D 7/08* | (2006.01) |

(52) U.S. Cl.
CPC .............. B26F 3/002 (2013.01); C30B 29/36 (2013.01); C30B 33/02 (2013.01); H01L 29/1608 (2013.01); *B26D 7/086* (2013.01)

(58) Field of Classification Search
CPC ....................... B23K 26/0057; B23K 26/0622; B23K 26/53; B23K 26/0006; B28D 5/0011; H01L 21/02; H01L 21/02008; H01L 21/0201; H01L 29/1608
See application file for complete search history.

(56) References Cited

U.S. PATENT DOCUMENTS

| | | | |
|---|---|---|---|
| 6,191,382 B1* | 2/2001 | Damikolas | B23K 26/04 156/272.8 |
| 9,620,415 B2* | 4/2017 | Hirata | H01L 21/78 |
| 9,868,177 B2* | 1/2018 | Hirata | B23K 26/0057 |
| 9,981,339 B2* | 5/2018 | Hirata | B23K 26/0057 |
| 2003/0141505 A1* | 7/2003 | Isobe | H01L 27/12 257/66 |

(Continued)

FOREIGN PATENT DOCUMENTS

| | | |
|---|---|---|
| JP | 2000-094221 | 4/2000 |
| JP | 2013-049161 | 3/2013 |

*Primary Examiner* — Seahvosh Nikmanesh
(74) *Attorney, Agent, or Firm* — Greer, Burns & Crain, Ltd.

(57) ABSTRACT

An SiC wafer producing method includes setting a focal point of a pulsed laser beam to a single crystal SiC inside an ingot at a predetermined depth from an end surface of the ingot, the predetermined depth corresponding to the thickness of the wafer to be produced. The pulsed laser beam is applied to the ingot, thereby forming a small circular modified portion on a c-plane present in the ingot at the predetermined depth, in which the modified portion is a region where SiC has been decomposed into Si and C. A separation layer is formed for separating the wafer from the ingot, the separation layer being composed of a plurality of continuous modified portions and a plurality of cracks isotropically formed on the c-plane so as to extend from each modified portion.

6 Claims, 7 Drawing Sheets

(56) References Cited

U.S. PATENT DOCUMENTS

| | | | |
|---|---|---|---|
| 2012/0055546 A1* | 3/2012 | Turner | B23K 26/073 |
| | | | 136/256 |
| 2012/0111495 A1* | 5/2012 | Shimoi | B23K 26/0057 |
| | | | 156/250 |
| 2016/0052090 A1* | 2/2016 | Tanigawa | B23K 26/0624 |
| | | | 219/121.69 |
| 2016/0093763 A1* | 3/2016 | Rana | B23K 26/0084 |
| | | | 438/57 |
| 2016/0193690 A1* | 7/2016 | Hirata | B23K 26/0057 |
| | | | 225/2 |
| 2016/0354863 A1* | 12/2016 | Hirata | B23K 26/0057 |
| 2017/0014944 A1* | 1/2017 | Hirata | B23K 26/0057 |
| 2017/0053829 A1* | 2/2017 | Hirata | H01L 21/78 |
| 2017/0301549 A1* | 10/2017 | Suzuki | B23K 26/402 |
| 2017/0355041 A1* | 12/2017 | Yamashita | B23K 26/0057 |
| 2018/0154542 A1* | 6/2018 | Hirata | B26F 3/002 |
| 2018/0154543 A1* | 6/2018 | Hirata | B26F 3/002 |

\* cited by examiner

SIC WAFER PRODUCING METHOD

BACKGROUND OF THE INVENTION

Field of the Invention

The present invention relates to an SiC wafer producing method for producing an SiC wafer from a single crystal SiC ingot.

Description of the Related Art

Various devices such as integrated circuits (ICs) or large-scale integration (LSI) circuits, and light emitting diodes (LEDs) are formed by forming a functional layer on the front side of a wafer formed of Si (silicon) or $Al_2O_3$ (sapphire) and partitioning this functional layer into a plurality of separate regions along a plurality of division lines. Further, power devices or optical devices such as LEDs are formed by forming a functional layer on the front side of a wafer formed of single crystal SiC (silicon carbide) and partitioning this functional layer into a plurality of separate regions along a plurality of division lines. The division lines of such a wafer having these devices are processed by a processing apparatus such as a cutting apparatus and a laser processing apparatus to thereby divide the wafer into a plurality of individual device chips corresponding to the devices. The device chips thus obtained are used in various electrical equipment such as mobile phones and personal computers.

In general, the wafer on which the devices are to be formed is produced by slicing a cylindrical ingot with a wire saw. Both sides of the wafer sliced from the ingot are polished to a mirror finish (see Japanese Patent Laid-open No. 2000-94221). However, when the ingot is cut by the wire saw and both sides of each wafer are polished to obtain the product, a large proportion (70% to 80%) of the ingot is discarded to cause a problem of poor economy. In particular, a single crystal SiC ingot has high hardness and it is therefore difficult to cut this ingot with the wire saw. Accordingly, considerable time is required for cutting of the ingot, causing a reduction in productivity. Furthermore, since this ingot is high in unit price, there is a problem in efficiently producing a wafer in this prior art.

A technique for solving this problem has been proposed (see Japanese Patent Laid-open No. 2013-49161). This technique includes the steps of setting the focal point of a laser beam having a transmission wavelength to single crystal SiC inside a single crystal SiC ingot, next applying the laser beam to the SiC ingot as scanning the laser beam on the ingot to thereby form modified layers in a separation plane previously set inside the ingot, and next breaking the ingot along the separation plane where the modified layers are formed, thus separating an SiC wafer from the SiC ingot.

SUMMARY OF THE INVENTION

However, in producing the SiC wafer from the SiC ingot by using the method described in Japanese Patent Laid-open No. 2013-49161, there is a problem such that the modified layers must be densely formed with a pitch of approximately 10 μm, causing a reduction in productivity.

It is therefore an object of the present invention to provide an SiC wafer producing method which can improve the productivity of wafers.

In accordance with an aspect of the present invention, there is provided an SiC wafer producing method for producing an SiC wafer from a single crystal SiC ingot having an end surface, a c-axis intersecting the end surface, and a c-plane perpendicular to the c-axis, the SiC wafer producing method including a modified portion forming step of setting a focal point of a pulsed laser beam having a transmission wavelength to single crystal SiC inside the SiC ingot at a predetermined depth from the end surface, the predetermined depth corresponding to the thickness of the SiC wafer to be produced, and next applying the pulsed laser beam to the SiC ingot, thereby forming a small circular modified portion on the c-plane at the predetermined depth, the modified portion being a region where SiC has been decomposed into Si and C; a separation layer forming step of forming a separation layer for separating the SiC wafer from the SiC ingot, the separation layer being composed of a plurality of continuous modified portions each formed by the modified portion forming step and a plurality of cracks isotropically formed on the c-plane so as to extend from each modified portion; and a wafer producing step of separating a part of the SiC ingot along the separation layer as an interface, thereby producing the SiC wafer; the separation layer forming step including a modified portion formation repeating step of repeating the modified portion forming step as relatively feeding the SiC ingot and the focal point to continuously form the modified portions on the c-plane and also to isotropically form the cracks on the c-plane in a region where the relation of D>L is satisfied, where D is the diameter of each modified portion and L is the spacing between the adjacent focal points in a feeding direction; and an indexing step of relatively indexing the SiC ingot and the focal point in the range not greater than the width of the cracks; the modified portion formation repeating step and the indexing step being alternately performed to form the separation layer, in which the cracks adjacent to each other in an indexing direction are connected.

Preferably, the cracks are formed in a region where the relation of 0.75D>L>0.1D is satisfied, where D is the diameter of each modified portion and L is the spacing between the adjacent focal points in the feeding direction, in the separation layer forming step. Preferably, the energy per pulse of the pulsed laser beam to be applied in the separation layer forming step is set to 9 μJ or more. Preferably, the modified portions are continuously formed in the condition where the focal point is set on the same c-plane in the separation layer forming step.

Preferably, the c-axis is inclined by an off angle with respect to a normal to the end surface of the SiC ingot; the modified portion formation repeating step in the separation layer forming step including the step of continuously forming the modified portions in a first direction perpendicular to a second direction where the off angle is formed between the c-plane and the end surface; the indexing step in the separation layer forming step including the step of relatively indexing the SiC ingot and the focal point in the second direction in the range not greater than the width of the cracks, thereby connecting the cracks in the second direction. In another case, the c-axis coincides with a normal to the end surface of the SiC ingot; the modified portion formation repeating step in the separation layer forming step including the step of continuously forming the modified portions in the feeding direction; the indexing step in the separation layer forming step including the step of relatively indexing the SiC ingot and the focal point in the indexing direction in the range not greater than the width of the cracks, thereby connecting the cracks in the indexing direction.

According to the SiC wafer producing method of the present invention, the separation layer is composed of the plural modified portions continuously formed so as to extend linearly in the feeding direction and the plural cracks isotropically extending from each modified portion, and the cracks adjacent in the indexing direction are connected with each other. After forming the separation layer, a part of the SiC ingot can be separated along the separation layer as an interface to thereby efficiently produce the SiC wafer having a desired thickness. Further, the amount of an ingot portion to be discarded can be reduced to thereby improve the productivity.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

The SiC wafer producing method of the present invention is applicable regardless of whether or not the c-axis in a single crystal SiC ingot is inclined with respect to a normal to an end surface of the single crystal SiC ingot. In the case that the c-axis is not inclined with respect to the normal to the end surface, i.e., in the case that the c-axis coincides with the normal to the end surface, there will now be described a first preferred embodiment of the SiC wafer producing method of the present invention with reference to FIGS. 1 to 7.

Figure 1:
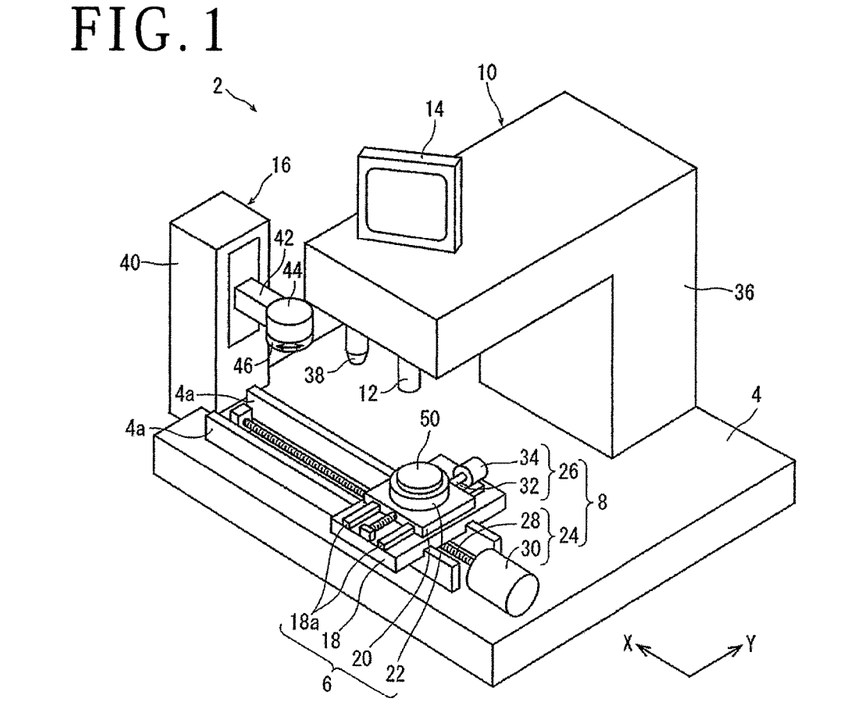
FIG. 1 is a perspective view of a laser processing apparatus.

Referring to FIG. 1, there is shown a laser processing apparatus 2 for performing the SiC wafer producing method according to this preferred embodiment. The laser processing apparatus 2 shown in FIG. 1 includes a base 4, holding means 6 for holding a workpiece, moving means 8 for moving the holding means 6, laser beam applying means 10 for applying a laser beam to the workpiece held by the holding means 6, imaging means 12 for imaging the workpiece held by the holding means 6, display means 14 for displaying an image obtained by the imaging means 12, and separating means 16 for separating a part of the workpiece held by the holding means 6.

The holding means 6 includes a rectangular X movable plate 18 mounted on the base 4 so as to be movable in an X direction, a rectangular Y movable plate 20 mounted on the X movable plate 18 so as to be movable in a Y direction, and a cylindrical chuck table 22 rotatably mounted on the upper surface of the Y movable plate 20. The X direction is defined as the direction shown by an arrow X in FIG. 1, and the Y direction is defined as the direction shown by an arrow Y in FIG. 1, which is perpendicular to the X direction in an XY plane. The XY plane defined by the X direction and the Y direction is a substantially horizontal plane.

The moving means 8 includes X moving means 24, Y moving means 26, and rotating means (not shown). The X moving means 24 includes a ball screw 28 extending in the X direction on the base 4 and a motor 30 connected to one end of the ball screw 28. The ball screw 28 has a nut portion (not shown), which is fixed to the lower surface of the X movable plate 18. The X moving means 24 is operated in such a manner that the rotary motion of the motor 30 is converted into a linear motion by the ball screw 28 and this linear motion is transmitted to the X movable plate 18, so that the X movable plate 18 is moved in the X direction along a pair of guide rails 4a provided on the base 4. Similarly, the Y moving means 26 includes a ball screw 32 extending in the Y direction on the X movable plate 18 and a motor 34 connected to one end of the ball screw 32. The ball screw 32 has a nut portion (not shown), which is fixed to the lower surface of the Y movable plate 20. The Y moving means 26 is operated in such a manner that the rotary motion of the motor 34 is converted into a linear motion by the ball screw 32 and this linear motion is transmitted to the Y movable plate 20, so that the Y movable plate 20 is moved in the Y direction along a pair of guide rails 18a provided on the X movable plate 18. The rotating means has a motor (not shown) built in the chuck table 22 to rotate the chuck table 22 with respect to the Y movable plate 20.

The laser beam applying means 10 includes an L-shaped casing 36 provided on the base 4 at its rear end portion, oscillating means (not shown) built in the casing 36, focusing means 38 mounted on the lower surface of the casing 36 at its front end portion, and focal position adjusting means (not shown). The L-shaped casing 36 is composed of a vertical portion extending upward from the upper surface of the base 4 and a horizontal portion extending from the upper end of the vertical portion in a substantially horizontal direction. Although not shown, the oscillating means includes a laser oscillator for oscillating a pulsed laser beam LB, frequency setting means for setting the repetition frequency F of the pulsed laser beam LB to be oscillated from the laser oscillator, and power adjusting means for adjusting the power of the pulsed laser beam LB oscillated from the laser oscillator. The focusing means 38 has a focusing lens (not shown) for focusing the pulsed laser beam LB oscillated from the laser oscillator. The imaging means 12 is provided on the lower surface of the front end portion of the casing 36 so as to be spaced from the focusing means 38 in the X direction. The display means 14 is mounted on the upper surface of the front end portion of the casing 36.

The separating means 16 includes a columnar casing 40 extending upward from the upper surface of the base 4 at a position near the left ends of the guide rails 4a as viewed in FIG. 1. The separating means 16 further includes an arm 42 having a base end vertically movably supported to the casing 40 and a front end projecting from the casing 40 so as to extend in the X direction. Although not shown, elevating means for vertically moving the arm 42 is built in the casing 40. A motor 44 is provided at the front end of the arm 42. A disk-shaped suction member 46 is connected to the lower surface of the motor 44 so as to be rotatable about a vertical axis. The lower surface of the suction member 46 is formed with a plurality of suction holes (not shown), which are connected through a suction passage to suction means (not shown). Further, ultrasonic vibration applying means (not shown) is built in the suction member 46 to apply ultrasonic vibration to the lower surface of the suction member 46.

Figure 2:
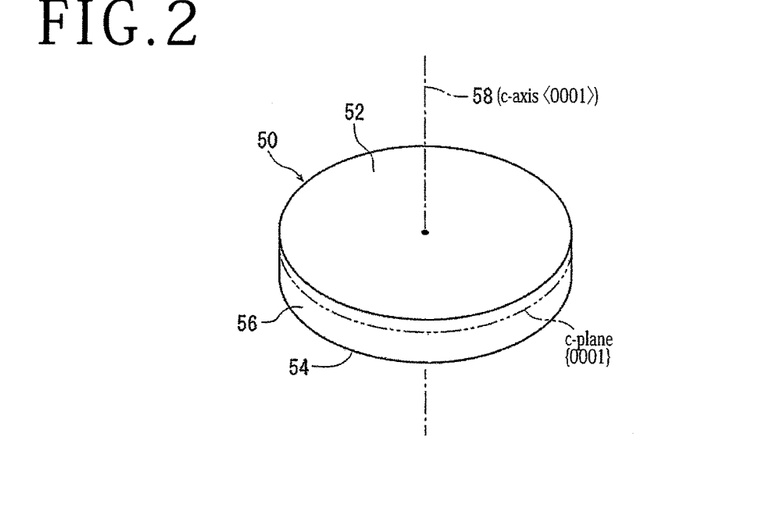
FIG. 2 is a perspective view of a single crystal SiC ingot having a c-axis coinciding with a normal to an end surface of the SiC ingot according to a first preferred embodiment of the present invention.

FIG. 2 shows a cylindrical hexagonal single crystal SiC ingot 50 (which will be hereinafter referred to simply as "ingot 50") as a workpiece to be processed. The ingot 50 has a circular first surface 52 (end surface), a circular second surface 54 opposite to the first surface 52, a cylindrical surface 56 formed so as to connect the first surface 52 and the second surface 54, a c-axis (<0001> direction) extending from the first surface 52 to the second surface 54, and a c-plane ({0001} plane) perpendicular to the c-axis. In the ingot 50, the c-axis is not inclined with respect to a normal 58 to the first surface 52. That is, the c-axis coincides with the normal 58.

In this preferred embodiment, a modified portion forming step is first performed to form a small circular modified portion on the c-plane at a predetermined depth from the first surface 52, in which the predetermined depth corresponds to the thickness of a wafer to be produced, and the modified portion is a region where SiC has been decomposed into Si and C. In the modified portion forming step, the ingot 50 is first fixed to the chuck table 22 in the condition where an adhesive (e.g., epoxy resin adhesive) is interposed between the second surface 54 of the ingot 50 and the upper surface of the chuck table 22. As a modification, the upper surface of the chuck table 22 may be formed with a plurality of suction holes, whereby a suction force may be produced on the upper surface of the chuck table 22 to thereby hold the ingot 50 under suction. Thereafter, the imaging means 12 is operated to image the ingot 50 from the upper side of the first surface 52. Thereafter, the moving means 8 is operated to move the chuck table 22 according to the image of the ingot 50 detected by the imaging means 12, thereby adjusting the positional relation between the ingot 50 and the focusing means 38 in the XY plane. Thereafter, the focal position adjusting means is operated to vertically move the focusing means 38, thereby setting a focal point FP at a predetermined depth from the first surface 52, in which this predetermined depth corresponds to the thickness of a wafer to be produced. Thereafter, a pulsed laser beam LB having a transmission wavelength to single crystal SiC is applied from the focusing means 38 to the ingot 50. As a result, a small circular modified portion 60 can be formed on the c-plane at the predetermined depth from the first surface 52, in which this depth corresponds to the thickness of a wafer to be produced, and the modified portion 60 is a region where SiC has been decomposed into Si and C.

After performing the modified portion forming step, a separation layer forming step is performed to form a separation layer for separating the wafer from the ingot 50. This separation layer forming step is composed of a modified portion formation repeating step of repeating the modified portion forming step mentioned above to continuously form a plurality of modified portions 60 on the same c-plane and also to isotropically form cracks on the same c-plane and an indexing step of relatively indexing the ingot 50 and the focal point FP in the range not greater than the width of the cracks (the length of extension of the cracks), in which the modified portion formation repeating step and the indexing step are alternately performed.

Figure 3A:
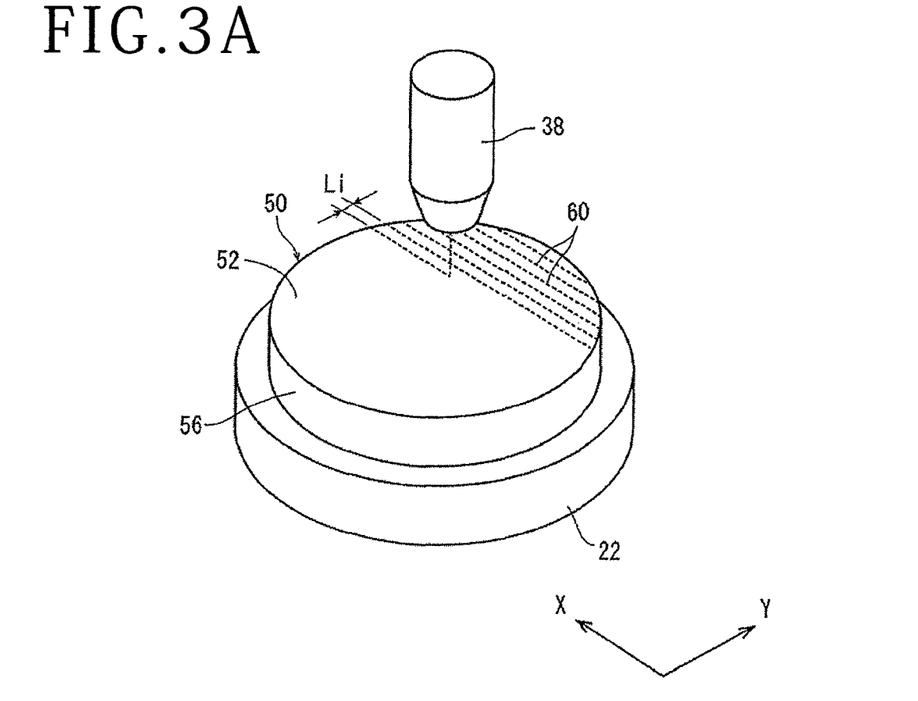
FIG. 3A is a perspective view showing a separation layer forming step of forming a separation layer in the SiC ingot shown in FIG. 2.
Figure 3B:
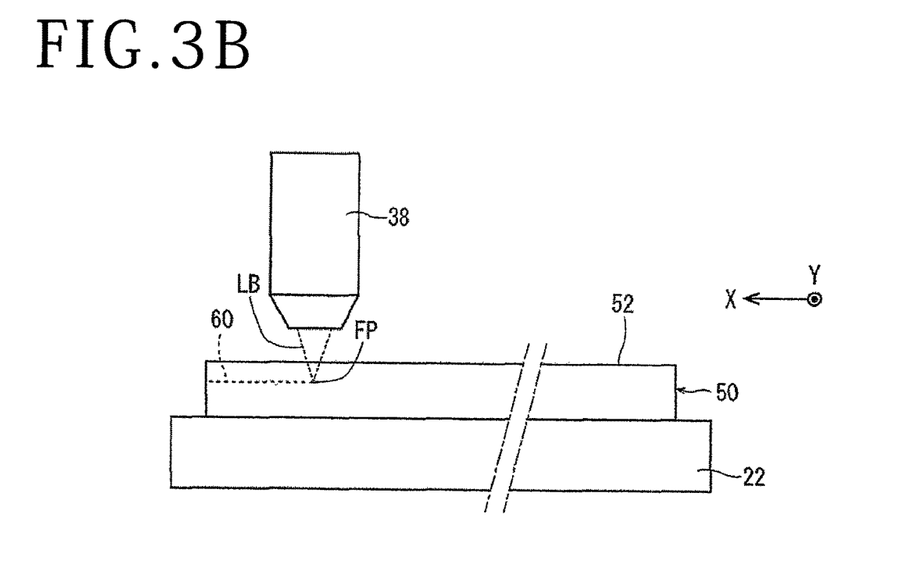
FIG. 3B is an elevational view of FIG. 3A.
Figure 4:
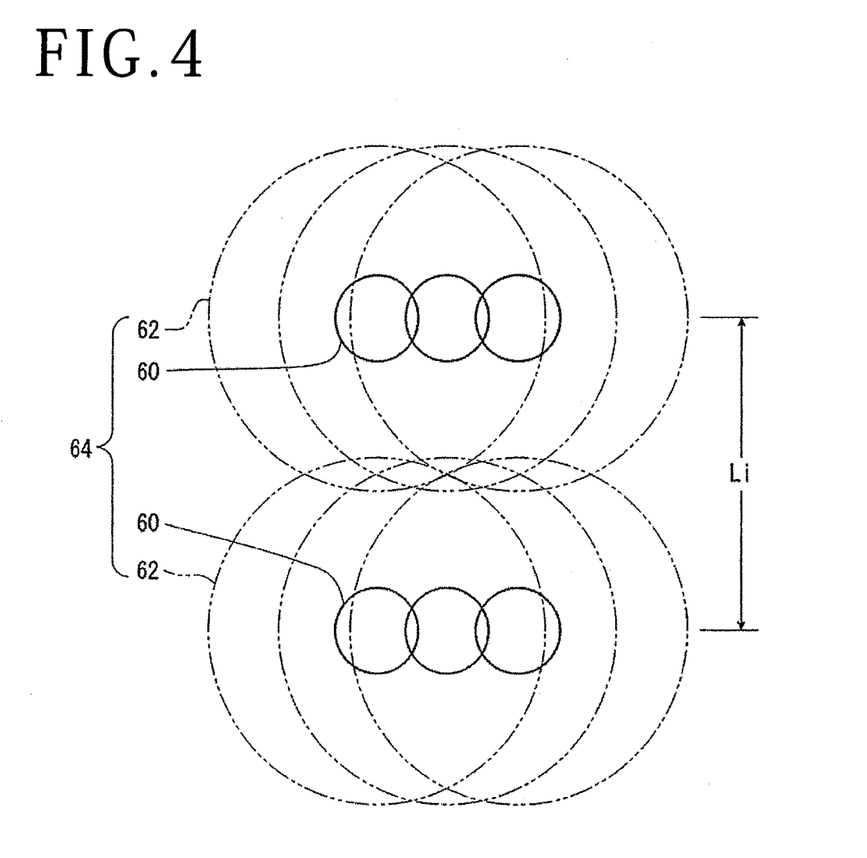
FIG. 4 is a schematic plan view showing modified portions and cracks constituting the separation layer.

More specifically, the modified portion formation repeating step may be performed by relatively moving the focal point FP and the chuck table 22. For example, as shown in FIGS. 3A and 3B, the chuck table 22 may be moved in the X direction at a predetermined feed speed by operating the X moving means 24 without moving the focal point FP, and at the same time the pulsed laser beam LB having a transmission wavelength to single crystal SiC may be applied from the focusing means 38 to the ingot 50. As a result, a plurality of modified portions 60 can be formed continuously and linearly in the X direction on the same c-plane at a predetermined depth from the first surface 52, this predetermined depth corresponding to the thickness of a wafer to be produced. At the same time, as shown in FIG. 4, a plurality of cracks can be formed so as to extend isotropically from each modified portion 60 along the same c-plane. In FIG. 4, these cracks extending isotropically from each modified portion 60 are represented by a circular area 62 shown by a phantom line.

Figure 5:
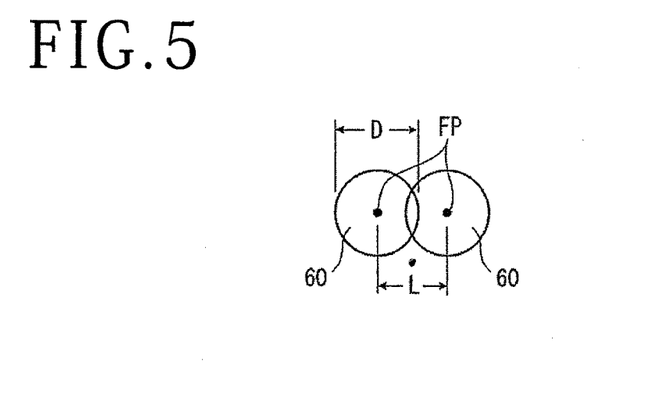
FIG. 5 is a schematic plan view of the adjacent modified portions continuously formed.

Referring to FIG. 5, D denotes the diameter of each modified portion 60 and L denotes the spacing between the adjacent focal points FP spaced in the feeding direction (X direction), in which the cracks 62 are formed isotropically from each modified portion 60 on the same c-plane in a region where the relation of D>L is satisfied (i.e., the adjacent modified portions 60 arranged in the feeding direction, or in the X direction are overlapped). The spacing L between the adjacent focal points FP spaced in the feeding direction is defined by the relative speed V between the focal point FP and the chuck table 22 and the repetition frequency F of the pulsed laser beam LB (L=V/F). In this preferred embodiment, the relation of D>L can be satisfied by adjusting the feed speed V of the chuck table 22 in the X direction relative to the focal point FP and the repetition frequency F of the pulsed laser beam LB.

After performing the modified portion formation repeating step along a line, the indexing step is performed to move the chuck table 22 relative to the focal point FP in the Y direction by a predetermined index amount Li by operating the Y moving means 26 in the range not greater than the width of the cracks 62 (i.e., the diameter of the circular area 62 in FIG. 4). Thereafter, the modified portion formation repeating step and the indexing step are alternately performed plural times, so that a plurality of linear modified layers extending in the X direction are formed so as to be spaced by the index amount Li in the Y direction, in which each linear modified layer is composed of the plural modified portions 60 overlapped in the X direction. Furthermore, the cracks 62 adjacent to each other in the Y direction can be connected. Accordingly, a separation layer 64 composed of the plural modified portions 60 and the plural cracks 62 can be formed on the same c-plane at the predetermined depth from the first surface 52, which depth corresponds to the thickness of a wafer to be produced.

Figure 6:
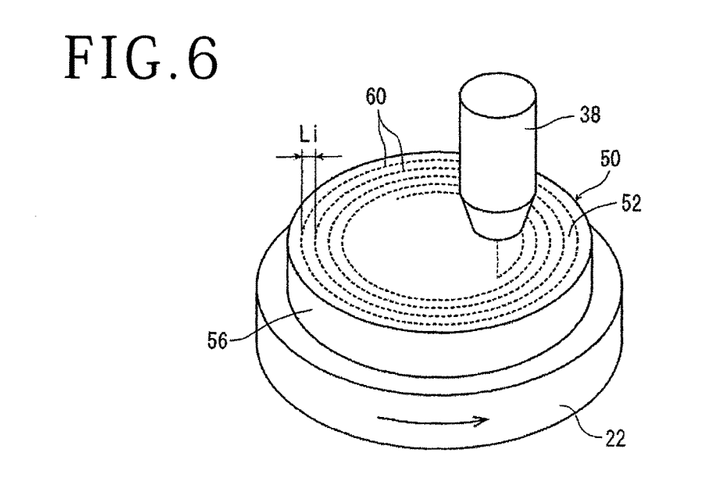
FIG. 6 is a perspective view showing a modification of the separation layer forming step, in which the modified portions are formed continuously along the circumference of the SiC ingot.

As described above, the modified portion formation repeating step may be performed by relatively moving the focal point FP and the chuck table 22. Accordingly, as a modification, the modified portion formation repeating step may be performed by rotating the chuck table 22 as shown in FIG. 6. More specifically, the rotating means (not shown) is operated to rotate the chuck table 22 at a predetermined speed relative to the focal point FP fixed in the counterclockwise direction (or the clockwise direction) as viewed in plan. At the same time, the pulsed laser beam LB having a transmission wavelength to single crystal SiC is applied from the focusing means 38 to the ingot 50. As a result, a plurality of modified portions 60 are continuously formed on the same c-plane at the predetermined depth from the first surface 52, which depth corresponds to the thickness of a wafer to be produced, in such a manner that an annular modified layer is formed by these plural modified portions 60 along the circumference of the ingot 50. At the same time, a plurality of cracks 62 can be formed so as to extend isotropically from each modified portion 60. As described above, the cracks 62 are formed isotropically from each modified portion 60 along the same c-plane in the region where the relation of D>L is satisfied, in which D denotes the diameter of each modified portion 60 and L denote the spacing between the adjacent focal points FP spaced in the feeding direction. Further, the spacing L is defined by the relative speed V between the focal point FP and the chuck table 22 and the repetition frequency F of the pulsed laser beam LB (L=V/F). In the case shown in FIG. 6, the relation of D>L can be satisfied by adjusting the peripheral speed V of the chuck table 22 relative to the focal point FP at the position of the focal point FP.

In the case shown in FIG. 6 where the modified portion formation repeating step is performed by rotating the chuck table 22, the indexing step is next performed by operating the X moving means 23 or the Y moving means 26 to move the chuck table 22 relative to the focal point FP in the radial direction of the ingot 50 by the predetermined index amount Li in the range not greater than the width of the cracks 62. Thereafter, the modified portion formation repeating step and the indexing step are alternately performed plural times, so that a plurality of annular modified layers extending along the circumference of the ingot 50 are formed concentrically so as to be spaced by the index amount Li in the radial direction of the ingot 50, in which each annular modified layer is composed of the plural modified portions 60 overlapped in the circumferential direction of the ingot 50. Further, the cracks 62 adjacent to each other in the radial direction of the ingot 50 can be connected. Accordingly, a similar separation layer 64 composed of the plural modified portions 60 and the plural cracks 62 can be formed on the same c-plane at the predetermined depth from the first surface 52, which depth corresponds to the thickness of a wafer to be produced.

Figure 7:
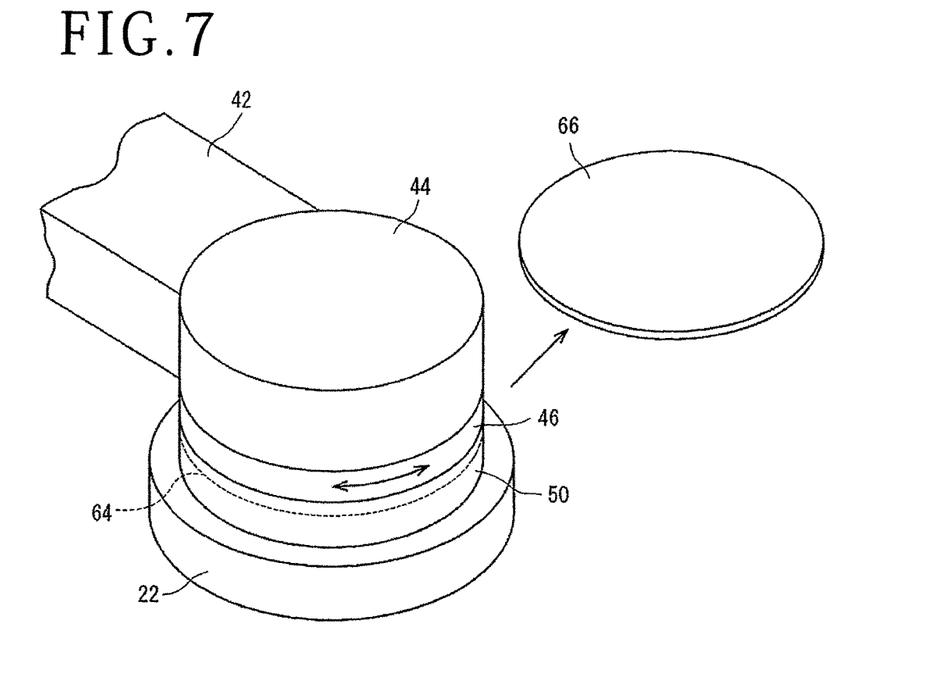
FIG. 7 is a perspective view showing a wafer producing step.

After performing the separation layer forming step, a wafer producing step is performed to separate a part of the ingot 50 along the separation layer 64 as an interface, thereby producing a wafer. In the wafer producing step, the moving means 8 is first operated to move the chuck table 22 to a position below the suction member 46. Thereafter, the elevating means provided in the casing 40 is operated to lower the arm 42 until the lower surface of the suction member 46 comes into close contact with the first surface 52 of the ingot 50 as shown in FIG. 7. Thereafter, the suction means connected to the suction member 46 is operated to hold the first surface 52 of the ingot 52 to the lower surface of the suction member 46 under suction. Thereafter, the ultrasonic vibration applying means built in the suction member 46 is operated to apply ultrasonic vibration to the lower surface of the suction member 46. At the same time, the motor 44 is operated to rotate the suction member 46. As a result, a part of the ingot 50 can be separated along the separation layer 64 as an interface to thereby produce a wafer 66 having a desired thickness as shown in FIG. 7.

As described above, the separation layer 64 is composed of the plural modified portions 60 continuously formed so as to extend linearly in the feeding direction and the plural cracks 62 isotropically extending from each modified portion 60, and the cracks 62 adjacent in the indexing direction are connected with each other. After forming the separation layer 64, a part of the ingot 50 can be separated along the separation layer 64 as an interface to thereby efficiently produce the wafer 66 having a desired thickness. Further, the amount of an ingot portion to be discarded can be reduced to thereby improve the productivity.

In the case that the c-axis in a single crystal SiC ingot is inclined with respect to the normal to the end surface, there will now be described a second preferred embodiment of the SiC wafer producing method of the present invention with reference to FIGS. 8A to 10B.

Figure 8A:
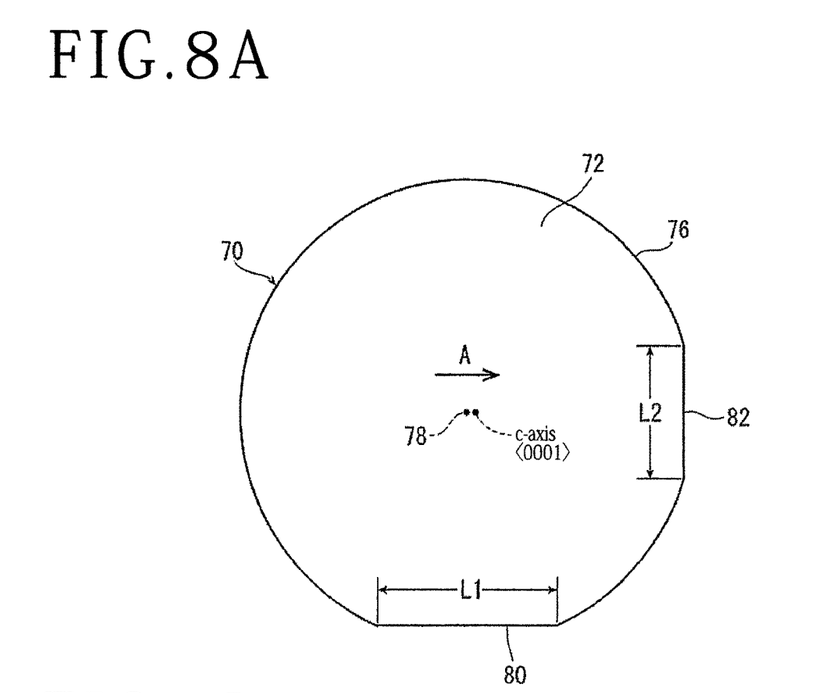
FIG. 8A is a plan view of a single crystal SiC ingot having a c-axis inclined with respect to a normal to an end surface of the SiC ingot according to a second preferred embodiment of the present invention.
Figure 8B:
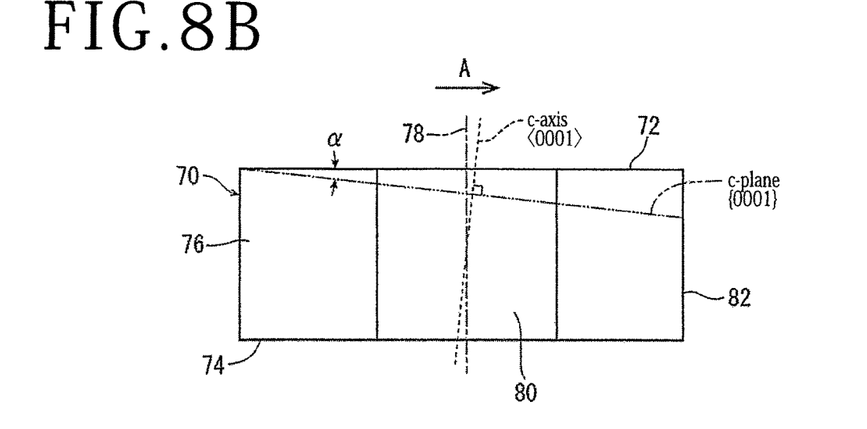
FIG. 8B is an elevational view of FIG. 8A.

FIGS. 8A and 8B show a generally cylindrical hexagonal single crystal SiC ingot 70 (which will be hereinafter referred to simply as "ingot 70") as a workpiece to be processed. The ingot 70 has a substantially circular first surface 72 (end surface), a substantially circular second surface 74 opposite to the first surface 72, a substantially cylindrical surface 76 formed so as to connect the first surface 72 and the second surface 74, a c-axis (<0001> direction) extending from the first surface 72 to the second surface 74, and a c-plane ({0001} plane) perpendicular to the c-axis. In the ingot 70, the c-axis is inclined by an off angle α with respect to a normal 78 to the first surface 72. The off angle α (e.g., α=4 degrees) is formed between the c-plane and the first surface 72 (the direction of formation of the off angle α is shown by an arrow A in FIGS. 8A and 8B). Further, the cylindrical surface 76 of the ingot 70 is formed with a first orientation flat 80 and a second orientation flat 82, which are rectangular in side elevation and function to indicate crystal orientation. The first orientation flat 80 is parallel to the direction A of formation of the off angle α, and the second orientation flat 82 is perpendicular to the direction A of formation of the off angle α. As shown in FIG. 8A, which is a plan view taken in the direction of extension of the normal 78, the length L2 of the second orientation flat 82 is set shorter than the length L1 of the first orientation flat 80 (L2<L1).

Figure 9A:
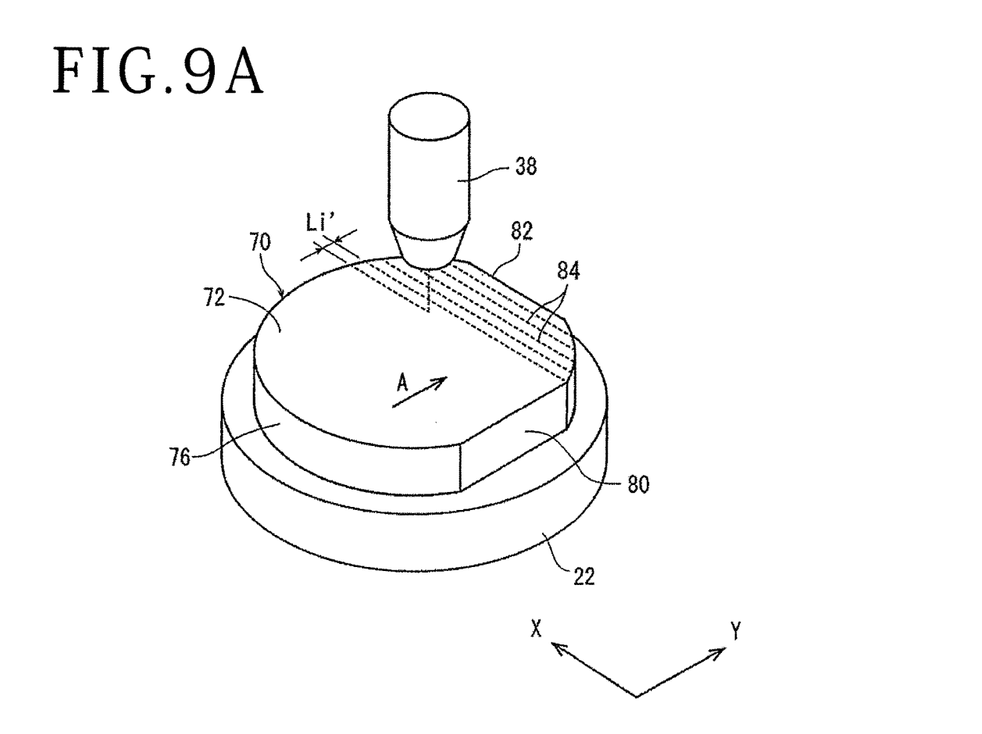
FIG. 9A is a perspective view showing a separation layer forming step of forming a separation layer in the SiC ingot shown in FIGS. 8A and 8B.

In this preferred embodiment, a modified portion forming step is first performed to form a small circular modified portion on the c-plane at a predetermined depth from the first surface 72, in which this predetermined depth corresponds to the thickness of a wafer to be produced, and the modified portion is a region where SiC has been decomposed into Si and C. In the modified portion forming step, the ingot 70 is fixed to the chuck table 22 in the condition where an adhesive (e.g., epoxy resin adhesive) is interposed between the second surface 74 of the ingot 70 and the upper surface of the chuck table 22. As a modification, the upper surface of the chuck table 22 may be formed with a plurality of suction holes, whereby a suction force may be produced on the upper surface of the chuck table 22 to thereby hold the ingot 70 under suction. Thereafter, the imaging means 12 is operated to image the ingot 70 from the upper side of the first surface 72. Thereafter, the moving means 8 is operated to move and rotate the chuck table 22 according to the image of the ingot 70 detected by the imaging means 12, thereby adjusting the orientation of the ingot 70 to a predetermined orientation and also adjusting the positional relation between the ingot 70 and the focusing means 38 in the XY plane. In adjusting the orientation of the ingot 70 to a predetermined orientation, the first orientation flat 80 is made parallel to the Y direction and the second orientation flat 82 is made parallel to the X direction as shown in FIG. 9A. Accordingly, the direction A of formation of the off angle α is made parallel to the Y direction, and the direction perpendicular to the direction A of formation of the off angle α is made parallel to the X direction. Thereafter, the focal position adjusting means is operated to vertically move the focusing means 38, thereby setting a focal point FP at a predetermined depth from the first surface 72, in which this predetermined depth corresponds to the thickness of a wafer to be produced. Thereafter, a pulsed laser beam LB having a transmission wavelength to single crystal SiC is applied from the focusing means 38 to the ingot 70. As a result, a small circular modified portion 84 can be formed on the c-plane at the predetermined depth from the first surface 72, in which this depth corresponds to the thickness of a wafer to be produced, and the modified portion 84 is a region where SiC has been decomposed into Si and C.

After performing the modified portion forming step, a separation layer forming step is performed to form a separation layer for separating the wafer from the ingot 70. This separation layer forming step is composed of a modified portion formation repeating step of repeating the modified portion forming step mentioned above to continuously form a plurality of modified portions 84 on the same c-plane and also to isotropically form cracks on the same c-plane and an indexing step of relatively indexing the ingot 70 and the focal point FP in the range not greater than the width of the cracks (the length of extension of the cracks), in which the modified portion formation repeating step and the indexing step are alternately performed.

Figure 9B:
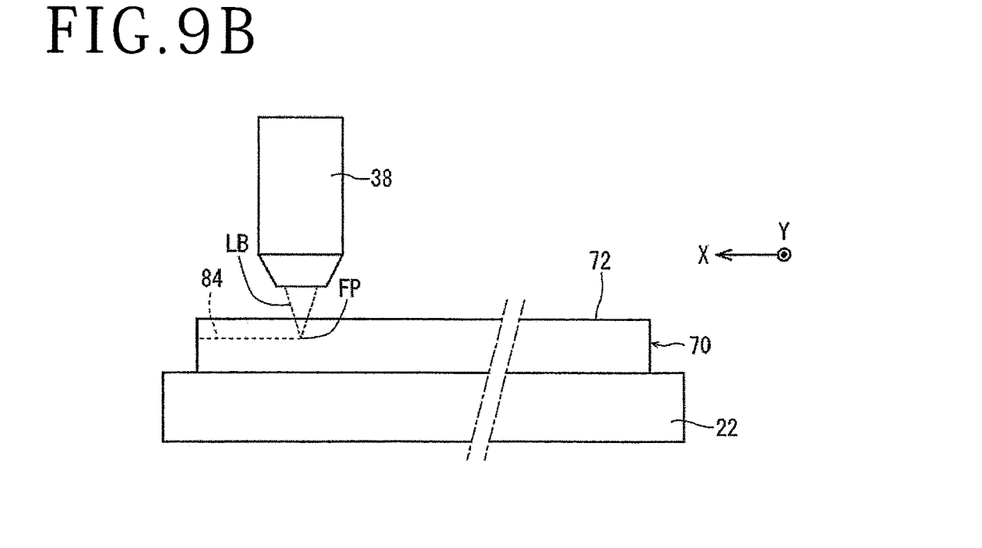
FIG. 9B is an elevational view of FIG. 9A.
Figure 10A:
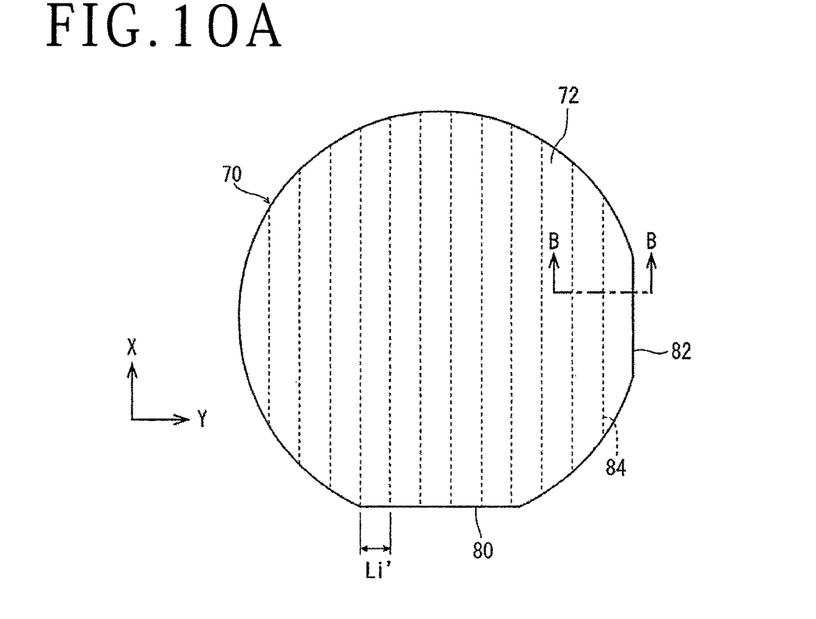
FIG. 10A is a plan view of the SiC ingot processed by the separation layer forming step shown in FIGS. 9A and 9B.
Figure 10B:
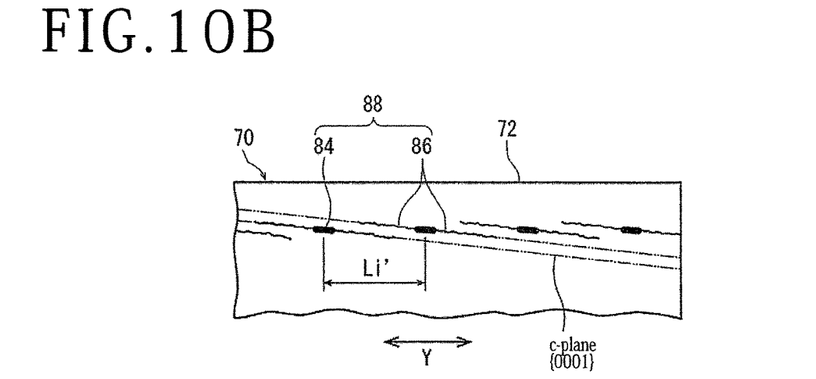
FIG. 10B is a cross section taken along the line B-B in FIG. 10A.

More specifically, the modified portion formation repeating step may be performed by relatively moving the focal point FP and the chuck table 22. For example, as shown in FIGS. 9A and 9B, the chuck table 22 may be moved in the X direction (i.e., in the direction perpendicular to the direction A of formation of the off angle α) at a predetermined feed speed by operating the X moving means 24 without moving the focal point FP, and at the same time the pulsed laser beam LB having a transmission wavelength to single crystal SiC may be applied from the focusing means 38 to the ingot 70. As a result, a plurality of modified portions 84 can be formed continuously and linearly in the X direction (i.e., in the direction perpendicular to the direction A of formation of the off angle α) on the same c-plane at a predetermined depth from the first surface 72, this predetermined depth corresponding to the thickness of a wafer to be produced. At the same time, as shown in FIG. 10B, a plurality of cracks 86 can be formed so as to extend isotropically from each modified portion 84 along the same c-plane. As described above, letting D denote the diameter of each modified portion 84 and L denote the spacing between the adjacent focal points FP spaced in the feeding direction (X direction), the cracks 86 are formed isotropically from each modified portion 84 on the same c-plane in a region where the relation of D>L is satisfied. The spacing L between the adjacent focal points FP spaced in the feeding direction is defined by the relative speed V between the focal point FP and the chuck table 22 and the repetition frequency F of the pulsed laser beam LB (L=V/F). In this preferred embodiment, the relation of D>L can be satisfied by adjusting the feed speed V of the chuck table 22 in the X direction relative to the focal point FP and the repetition frequency F of the pulsed laser beam LB.

After performing the modified portion formation repeating step along a line, the indexing step is performed to move the chuck table 22 relative to the focal point FP in the Y direction (i.e., in the direction A of formation of the off angle α) by a predetermined index amount Li' by operating the Y moving means 26 in the range not greater than the width of the cracks 86. Thereafter, the modified portion formation repeating and the indexing step are alternately performed plural times, so that a plurality of linear modified layers extending in the X direction (i.e., in the direction perpendicular to the direction A of formation of the off angle α) are formed so as to be spaced by the index amount Li' in the Y direction (i.e., in the direction A of formation of the off angle α), in which each linear modified layer is composed of the plural modified portions 84 overlapped in the X direction. Furthermore, the cracks 86 adjacent to each other in the Y direction can be connected. Accordingly, a separation layer 88 composed of the plural modified portions 84 and the plural cracks 86 can be formed at the predetermined depth from the first surface 72, which depth corresponds to the thickness of a wafer to be produced.

After performing the separation layer forming step, a wafer producing step is performed to separate a part of the ingot 70 along the separation layer 88 as an interface, thereby producing a wafer. In the wafer producing step, the moving means 8 is first operated to move the chuck table 22 to a position below the suction member 46. Thereafter, the elevating means provided in the casing 40 is operated to lower the arm 42 until the lower surface of the suction member 46 comes into close contact with the first surface 72 of the ingot 70. Thereafter, the suction means connected to the suction member 46 is operated to hold the first surface 72 of the ingot 70 to the lower surface of the suction member 46 under suction. Thereafter, the ultrasonic vibration applying means built in the suction member 46 is operated to apply ultrasonic vibration to the lower surface of the suction member 46. At the same time, the motor 44 is operated to rotate the suction member 46. As a result, a part of the ingot 70 can be separated along the separation layer 88 as an interface to thereby produce a wafer having a desired thickness.

As described above, the SiC wafer producing method of the present invention is applicable also to the ingot 70 having a c-axis inclined with respect to the normal 78 to the first surface 72 (end surface). In this preferred embodiment, the separation layer 88 is composed of the plural modified portions 84 continuously formed so as to extend linearly in the feeding direction and the plural cracks 86 isotropically extending from each modified portion 84, and the cracks 86 adjacent in the indexing direction are connected with each other. After forming the separation layer 88, a part of the ingot 70 can be separated along the separation layer 88 as an interface to thereby efficiently produce the wafer having a desired thickness. Further, the amount of an ingot portion to be discarded can be reduced to thereby improve the productivity.

The present inventor performed a test on the energy per pulse (which will be hereinafter referred to as "pulse energy") for the formation of the separation layer in the single crystal SiC ingot and on the formation of the cracks in the region where the relation of D>L is satisfied, in which D is the diameter of each modified portion and L is the spacing between the adjacent focal points. The test was performed under the following test conditions.

(Test Conditions)
   Wavelength of the pulsed laser beam: 1064 nm
   Repetition frequency F: 5 to 200 kHz (the range of change)
   Pulse energy: 1 to 30 μJ (the range of change)
   Pulse width: 4 ns
   Spot diameter: 3 μm
   Numerical aperture (NA) of the focusing lens: 0.65
   Feed speed V: 200 mm/second
(Test 1)
A single crystal SiC ingot having a thickness of 500 μm and having a c-axis coinciding with a normal to the upper surface (end surface) of the ingot for testing was used (this single crystal SiC ingot for testing will be hereinafter referred to as "test ingot"). The focal point of the pulsed laser beam was set in the test ingot at a depth of 100 μm from the upper surface of the test ingot. Then, the pulsed laser beam was applied to the test ingot in the condition where the repetition frequency F was set to 30 kHz and the feed speed V was set to 200 mm/second, in which the pulse energy was increased from 1 μJ at intervals of 1 μJ. In this condition, the present inventor verified a critical point for the pulse energy at which the modified portions are continuously formed to thereby form the separation layer, in which SiC is decomposed into Si and C in each modified portion.
(Result of Test 1)
(1) When the pulse energy was 1 μJ and 2 μJ, no modified portion was formed.
(2) When the pulse energy was in the range of 3 to 8 μJ, modified portions were not continuously formed, but were intermittently formed.
(3) When the pulse energy was in the range of 9 to 30 μJ, modified portions were continuously formed. Accordingly, it was verified that the critical point for the pulse energy for the formation of the separation layer is 9 μJ.
(Test 2)
The focal point of the pulsed laser beam was set in the test ingot at a depth of 100 μm from the upper surface of the test ingot, and the pulsed laser beam was applied to the test ingot in the condition where the repetition frequency F was set to 5 kHz and the feed speed V was set to 200 mm/second, in which the pulse energy was increased from 10 μJ at intervals of 5 μJ. In this condition, the present inventor verified the diameter D of each modified portion formed at each pulse energy.
(Result of Test 2)

| Pulse energy | Diameter D of each modified portion |
|---|---|
| 10 μJ | 15.0 μm |
| 15 μJ | 15.7 μm |
| 20 μJ | 16.8 μm |
| 25 μJ | 16.9 μm |
| 30 μJ | 20.8 μm |

(Test 3)
The focal point of the pulsed laser beam was set in the test ingot at a depth of 100 μm from the upper surface of the test ingot, and the pulsed laser beam was applied to the test ingot in the condition where the pulse energy was set to 10 μJ and the feed speed V was set to 200 mm/second, in which the repetition frequency F was increased from 5 kHz at intervals of 1 kHz, thereby continuously forming modified portions.
(Result of Test 3)
(1) When the repetition frequency F was in the range of 5 to 17 kHz, modified portions were independently formed.

(2) When the repetition frequency F was 18 kHz, cracks having a diameter of 30 μm were formed and modified portions were connected with each other by these cracks. In this case, the ratio between the spacing L between the adjacent focal points and the diameter D of each modified portion is given as follows:

$$L/D = (V/F)/D$$
$$= \{200 \text{ (mm/second)}/18 \text{ (kHz)}\}/15.0 \text{ (μm)}$$
$$= \{200 \times 10^{-3} \text{ (m/second)}/18 \times 10^3 \text{ (Hz)}\}/15.0 \times 10^{-6} \text{ (m)}$$
$$= 0.74$$

Since the pulse energy is 10 μJ in this case, the diameter D of each modified portion is 15.0 μm as apparent from Result of Test 2.
(3) When the repetition frequency F was 40 kHz, cracks having a diameter of 55 μm were formed. Since cracks were formed at the repetition frequency F of 18 kHz as mentioned above, the repetition frequency F was subsequently increased from 20 kHz at intervals of 5 kHz.
(4) When the repetition frequency F was 140 kHz, cracks having a maximum diameter of 65 μm were formed. In this case, the ratio between the spacing L between the adjacent focal points and the diameter D of each modified portion is given as follows:

$$L/D = (V/F)/D$$
$$= \{200 \text{ (mm/second)}/140 \text{ (kHz)}\}/15.0 \text{ (μm)}$$
$$= 0.095$$

(5) When the repetition frequency F was greater than 140 kHz, the diameter of cracks was decreased.
(Test 4)
The focal point of the pulsed laser beam was set in the test ingot at a depth of 100 μm from the upper surface of the test ingot, and the pulsed laser beam was applied to the test ingot in the condition where the pulse energy was set to 15 μJ and the feed speed V was set to 200 mm/second, in which the repetition frequency F was increased from 5 kHz at intervals of 1 kHz, thereby continuously forming modified portions.
(Result of Test 4)
(1) When the repetition frequency F was in the range of 5 to 16 kHz, modified portions were independently formed.
(2) When the repetition frequency F was 17 kHz, cracks having a diameter of 45 μm were formed and modified portions were connected with each other by these cracks. In this case, the ratio between the spacing L between the adjacent focal points and the diameter D of each modified portion is given as follows:

$$L/D = (V/F)/D$$
$$= \{200 \text{ (mm/second)}/17 \text{ (kHz)}\}/15.7 \text{ (μm)}$$
$$= 0.75$$

Since the pulse energy is 15 μJ in this case, the diameter D of each modified portion is 15.7 μm as apparent from Result of Test 2.

(3) When the repetition frequency F was 40 kHz, cracks having a diameter of 80 μm were formed. Since cracks were formed at the repetition frequency F of 17 kHz as mentioned above, the repetition frequency F was subsequently increased from 20 kHz at intervals of 5 kHz.

(4) When the repetition frequency F was 160 kHz, cracks having a maximum diameter of 90 μm were formed. In this case, the ratio between the spacing L between the adjacent focal points and the diameter D of each modified portion is given as follows:

$$L/D = (V/F)/D$$
$$= \{200 \text{ (mm/second)}/160 \text{ (kHz)}\}/15.7 \text{ (μm)}$$
$$= 0.08$$

(5) When the repetition frequency F was greater than 160 kHz, the diameter of cracks was decreased.

(Test 5)

The focal point of the pulsed laser beam was set in the test ingot at a depth of 100 μm from the upper surface of the test ingot, and the pulsed laser beam was applied to the test ingot in the condition where the pulse energy was set to 20 μJ and the feed speed V was set to 200 mm/second, in which the repetition frequency F was increased from 5 kHz at intervals of 1 kHz, thereby continuously forming modified portions.

(Result of Test 5)

(1) When the repetition frequency F was in the range of 5 to 15 kHz, modified portions were independently formed.

(2) When the repetition frequency F was 16 kHz, cracks having a diameter of 70 μm were formed and modified portions were connected with each other by these cracks. In this case, the ratio between the spacing L between the adjacent focal points and the diameter D of each modified portion is given as follows:

$$L/D = (V/F)/D$$
$$= \{200 \text{ (mm/second)}/16 \text{ (kHz)}\}/16.8 \text{ (μm)}$$
$$= 0.74$$

Since the pulse energy is 20 μJ in this case, the diameter D of each modified portion is 16.8 μm as apparent from Result of Test 2.

(3) When the repetition frequency F was 50 kHz, cracks having a diameter of 100 μm were formed. Since cracks were formed at the repetition frequency F of 16 kHz as mentioned above, the repetition frequency F was subsequently increased from 20 kHz at intervals of 5 kHz.

(4) When the repetition frequency F was 120 kHz, cracks having a maximum diameter of 110 μm were formed. In this case, the ratio between the spacing L between the adjacent focal points and the diameter D of each modified portion is given as follows:

$$L/D = (V/F)/D$$
$$= \{200 \text{ (mm/second)}/120 \text{ (kHz)}\}/16.8 \text{ (μm)}$$
$$= 0.1$$

(5) When the repetition frequency F was greater than 120 kHz, the diameter of cracks was decreased.

(Test 6)

The focal point of the pulsed laser beam was set in the test ingot at a depth of 100 μm from the upper surface of the test ingot, and the pulsed laser beam was applied to the test ingot in the condition where the pulse energy was set to 25 μJ and the feed speed V was set to 200 mm/second, in which the repetition frequency F was increased from 5 kHz at intervals of 1 kHz, thereby continuously forming modified portions.

(Result of Test 6)

(1) When the repetition frequency F was in the range of 5 to 15 kHz, modified portions were independently formed.

(2) When the repetition frequency F was 16 kHz, cracks having a diameter of 70 μm were formed and modified portions were connected with each other by these cracks. In this case, the ratio between the spacing L between the adjacent focal points and the diameter D of each modified portion is given as follows:

$$L/D = (V/F)/D$$
$$= \{200 \text{ (mm/second)}/16 \text{ (kHz)}\}/16.9 \text{ (μm)}$$
$$= 0.74$$

Since the pulse energy is 25 μJ in this case, the diameter D of each modified portion is 16.9 μm as apparent from Result of Test 2.

(3) When the repetition frequency F was 100 kHz, cracks having a maximum diameter of 150 μm were formed. In this case, the ratio between the spacing L between the adjacent focal points and the diameter D of each modified portion is given as follows:

$$L/D = (V/F)/D$$
$$= \{200 \text{ (mm/second)}/100 \text{ (kHz)}\}/16.9 \text{ (μm)}$$
$$= 0.12$$

Since cracks were formed at the repetition frequency F of 16 kHz as mentioned above, the repetition frequency F was subsequently increased from 20 kHz at intervals of 5 kHz.

(4) When the repetition frequency F was greater than 100 kHz, the diameter of cracks was decreased.

(Test 7)

The focal point of the pulsed laser beam was set in the test ingot at a depth of 100 μm from the upper surface of the test ingot, and the pulsed laser beam was applied to the test ingot in the condition where the pulse energy was set to 30 μJ and the feed speed V was set to 200 mm/second, in which the repetition frequency F was increased from 5 kHz at intervals of 1 kHz, thereby continuously forming modified portions.

(Result of Test 7)

(1) When the repetition frequency F was in the range of 5 to 12 kHz, modified portions were independently formed.

(2) When the repetition frequency F was 13 kHz, cracks having a diameter of 70 μm were formed and modified portions were connected with each other by these cracks. In this case, the ratio between the spacing L between the adjacent focal points and the diameter D of each modified portion is given as follows:

$$L/D = (V/F)/D$$
$$= \{200 \text{ (mm/second)}/13 \text{ (kHz)}\}/20.8 \text{ (μm)}$$
$$= 0.74$$

Since the pulse energy is 30 μJ in this case, the diameter D of each modified portion is 20.8 μm as apparent from Result of Test 2.

(3) When the repetition frequency F was 50 kHz, cracks having a maximum diameter of 170 μm were formed. In this case, the ratio between the spacing L between the adjacent focal points and the diameter D of each modified portion is given as follows:

$$L/D = (V/F)/D$$
$$= \{200 \text{ (mm/second)}/50 \text{ (kHz)}\}/20.8 \text{ (μm)}$$
$$= 0.19$$

Since cracks were formed at the repetition frequency F of 13 kHz as mentioned above, the repetition frequency F was subsequently increased from 20 kHz at intervals of 5 kHz.

(4) When the repetition frequency F was greater than 50 kHz, the diameter of cracks was decreased.

From Results of Tests 1 to 7 mentioned above, the following conclusions (1) to (3) can be drawn.

(1) A pulse energy of 9 μJ or more is required for the formation of the separation layer in the single crystal SiC ingot. Further, a pulse energy of 10 μJ or more is preferable for the formation of stable and continuous modified portions.

(2) Cracks are formed in a region where the relation of D>L is satisfied, where D is the diameter of each modified portion and L is the spacing between the adjacent focal points.

(3) In particular, cracks are well formed in a region where the relation of 0.75D>L>0.1D is satisfied, so that a good separation layer can be formed.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An SiC wafer producing method for producing an SiC wafer from a single crystal SiC ingot having an end surface, a c-axis intersecting said end surface, and a c-plane perpendicular to said c-axis, said SiC wafer producing method comprising:
a modified portion forming step of setting a focal point of a pulsed laser beam having a transmission wavelength to single crystal SiC inside said single crystal SiC ingot at a predetermined depth from said end surface, said predetermined depth corresponding to the thickness of said SiC wafer to be produced, and next applying said pulsed laser beam to said single crystal SiC ingot, thereby forming a small circular modified portion on said c-plane at said predetermined depth, said modified portion being a region where SiC has been decomposed into Si and C;
a separation layer forming step of forming a separation layer for separating said SiC wafer from said single crystal SiC ingot, said separation layer being composed of a plurality of continuous modified portions each formed by said modified portion forming step and a plurality of cracks isotropically formed on said c-plane so as to extend from each of said modified portions; and
a wafer producing step of separating a part of said single crystal SiC ingot along said separation layer as an interface, thereby producing said SiC wafer;
said separation layer forming step including:
a modified portion formation repeating step of repeating said modified portion forming step as relatively feeding said single crystal SiC ingot and said focal point to continuously form said modified portions on said c-plane and also to isotropically form said cracks on said c-plane in a region where the relation of D>L is satisfied, where D is a diameter of each of said modified portions and L is a spacing between adjacent focal points in a feeding direction; and
an indexing step of relatively indexing said single crystal SiC ingot and said focal point in a range not greater than a width of said cracks;
said modified portion formation repeating step and said indexing step being alternately performed to form said separation layer, in which said cracks adjacent to each other in an indexing direction are connected.

2. The SiC wafer producing method according to claim 1, wherein said cracks are formed in a region where the relation of 0.75D>L>0.1D is satisfied, where D is the diameter of each of said modified portions and L is the spacing between the adjacent focal points in said feeding direction, in said separation layer forming step.

3. The SiC wafer producing method according to claim 1, wherein an energy per pulse of said pulsed laser beam to be applied in said separation layer forming step is set to 9 μJ or more.

4. The SiC wafer producing method according to claim 1, wherein said modified portions are continuously formed in a condition where said focal point is set on the same c-plane in said separation layer forming step.

5. The SiC wafer producing method according to claim 4, wherein
said c-axis is inclined by an off angle with respect to a normal to said end surface of said single crystal SiC ingot;
said modified portion formation repeating step in said separation layer forming step includes a step of continuously forming said modified portions in a first direction perpendicular to a second direction where said off angle is formed between said c-plane and said end surface;
said indexing step in said separation layer forming step includes the step of relatively indexing said single crystal SiC ingot and said focal point in said second direction in the range not greater than the width of said cracks, thereby connecting said cracks in said second direction.

6. The SiC wafer producing method according to claim 4, wherein
said c-axis coincides with a normal to said end surface of said single crystal SiC ingot;
said modified portion formation repeating step in said separation layer forming step includes the step of continuously forming said modified portions in said feeding direction;
said indexing step in said separation layer forming step includes the step of relatively indexing said single crystal SiC ingot and said focal point in said indexing direction in the range not greater than the width of said cracks, thereby connecting said cracks in said indexing direction.

\* \* \* \* \*